(12) United States Patent
Perng et al.

(10) Patent No.: US 8,796,759 B2
(45) Date of Patent: Aug. 5, 2014

(54) FIN-LIKE FIELD EFFECT TRANSISTOR (FINFET) DEVICE AND METHOD OF MANUFACTURING SAME

(75) Inventors: Tsu-Hsiu Perng, Hsin-Chu (TW); Chih Chieh Yeh, Taipei (TW); Tzu-Chiang Chen, Hsinchu (TW); Chia-Cheng Ho, Hsinchu (TW); Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 478 days.

(21) Appl. No.: 12/837,093

(22) Filed: Jul. 15, 2010

(65) Prior Publication Data
US 2012/0012932 A1 Jan. 19, 2012

(51) Int. Cl.
*H01L 29/76* (2006.01)
(52) U.S. Cl.
USPC .......... 257/328; 257/401; 257/E29.267; 438/157
(58) Field of Classification Search
USPC ............ 257/288, 328, 336, 401, E29.2, 257/E29.201, 19, E29.267; 438/157, 279
See application file for complete search history.

(56) References Cited

U.S. PATENT DOCUMENTS

| | | | |
|---|---|---|---|
| 6,706,571 B1 | 3/2004 | Yu et al. | |
| 6,800,910 B2 | 10/2004 | Lin et al. | |
| 6,858,478 B2 | 2/2005 | Chau et al. | |
| 7,187,059 B2 | 3/2007 | Chan et al. | |
| 7,190,050 B2 | 3/2007 | King et al. | |
| 7,202,139 B2 | 4/2007 | Yeo et al. | |
| 7,247,887 B2 | 7/2007 | King et al. | |
| 7,265,008 B2 | 9/2007 | King et al. | |
| 7,335,959 B2 * | 2/2008 | Curello et al. | 257/408 |
| 7,508,031 B2 | 3/2009 | Liu et al. | |
| 7,528,465 B2 | 5/2009 | King et al. | |
| 7,605,449 B2 | 10/2009 | Liu et al. | |
| 8,618,617 B2 * | 12/2013 | Chan et al. | 257/401 |
| 2005/0153490 A1 | 7/2005 | Yoon et al. | |
| 2006/0228862 A1 * | 10/2006 | Anderson et al. | 438/279 |
| 2007/0120156 A1 | 5/2007 | Liu et al. | |
| 2007/0122953 A1 | 5/2007 | Liu et al. | |
| 2007/0122954 A1 | 5/2007 | Liu et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Tuan N. Quach
(74) *Attorney, Agent, or Firm* — Haynes and Boone, LLP

(57) ABSTRACT

A FinFET device and method for fabricating a FinFET device is disclosed. An exemplary FinFET device includes a semiconductor substrate; a fin structure disposed over the semiconductor substrate; and a gate structure disposed on a portion of the fin structure. The gate structure traverses the fin structure and separates a source region and a drain region of the fin structure, the source and drain region defining a channel therebetween. The source and drain region of the fin structure include a strained source and drain feature. The strained source feature and the strained drain feature each include: a first portion having a first width and a first depth; and a second portion disposed below the first portion, the second portion having a second width and a second depth. The first width is greater than the second width, and the first depth is less than the second depth.

19 Claims, 13 Drawing Sheets

(56) References Cited

U.S. PATENT DOCUMENTS

| | | | |
|---|---|---|---|
| 2007/0128782 | A1 | 6/2007 | Liu et al. |
| 2007/0132053 | A1 | 6/2007 | King et al. |
| 2007/0228372 | A1 | 10/2007 | Yang et al. |
| 2007/0241399 | A1* | 10/2007 | Irisawa et al. ............. 257/347 |
| 2008/0258228 | A1 | 10/2008 | Chuang et al. |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0068810 | A1* | 3/2009 | Tsai et al. ............. 438/300 |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |
| 2011/0272739 | A1* | 11/2011 | Lee et al. ............. 257/192 |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

FIN-LIKE FIELD EFFECT TRANSISTOR (FINFET) DEVICE AND METHOD OF MANUFACTURING SAME

BACKGROUND

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A typical FinFET is fabricated with a thin "fin" (or fin structure) extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. FinFET devices also include strained source/drain features. The strained source/drain features use epitaxial (epi) silicon germanium (SiGe) to enhance carrier mobility and improve device performance in p-type devices, and epi silicon (Si) in n-type devices. Further advantages of FinFET devices include reducing the short channel effect and higher current flow. Although existing FinFET devices and methods of fabricating FinFET devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-7A are perspective views of a fin-like field effect transistor (FinFET) device at various fabrication stages of fabrication according to the method of FIG. 1.

FIGS. 2B-7B are diagrammatic cross-sectional views along a channel of the FinFET device illustrated in FIGS. 2A-7A, respectively.

DETAILED DESCRIPTION

Figure 1:
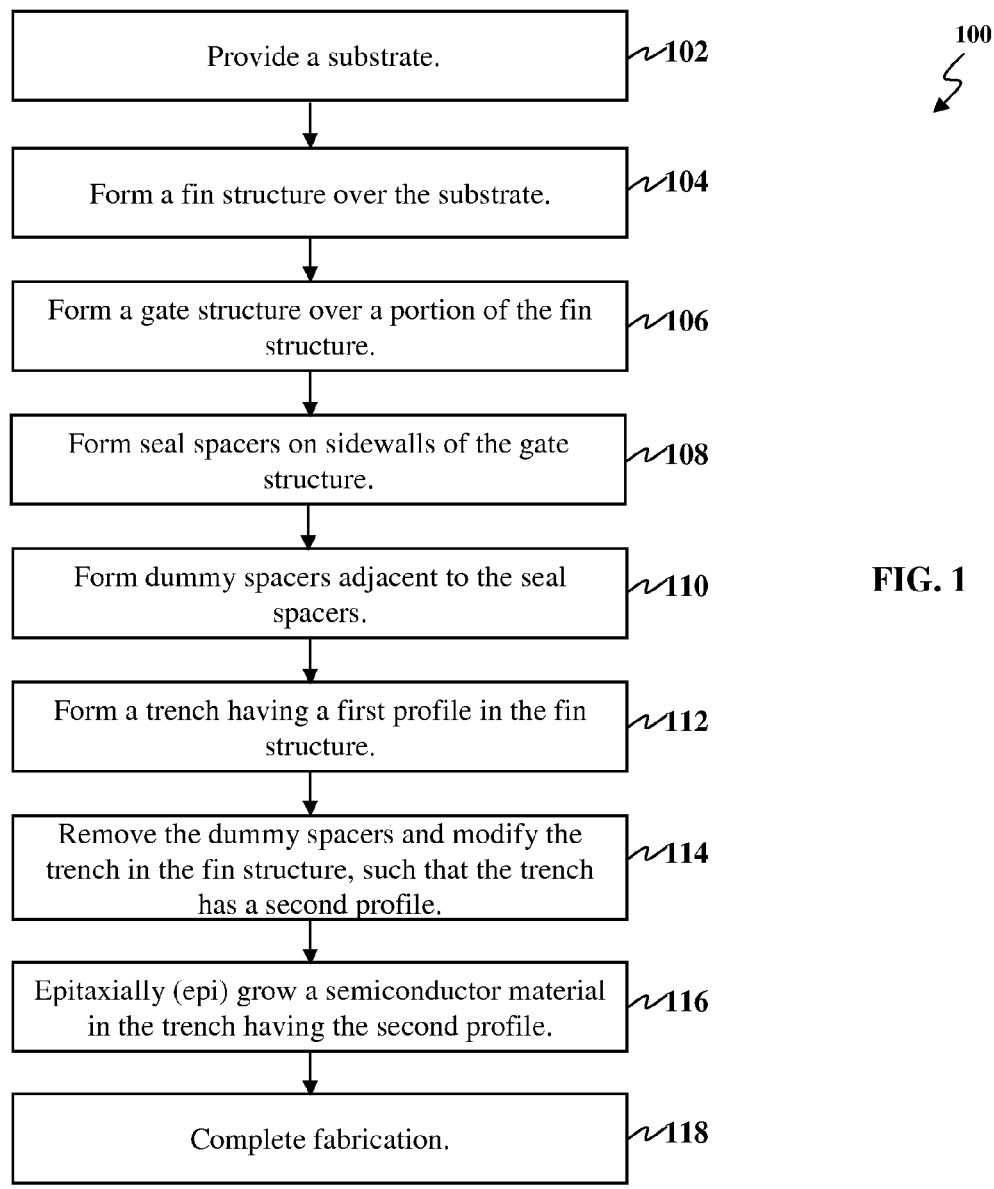
FIG. 1 is a flow chart of a method for fabricating an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 100 for fabricating an integrated circuit device according to various aspects of the present disclosure. In the present embodiment, the method 100 is for fabricating an integrated circuit device that includes a fin-like field effect transistor (FinFET) device. The method 100 begins at block 102 where a semiconductor substrate is provided. At blocks 104 and 106, a fin structure is formed over the substrate, and a gate structure is formed over a portion of the fin structure. At block 108, seal spacers are formed on sidewalls of the gate structure. The method continues with block 110 where dummy spacers are formed adjacent to the seal spacers. At block 112, a trench having a first profile is formed in the fin structure. At block 114, the dummy spacers are removed, and the trench in the fin structure is modified to have a second profile. At block 116, a semiconductor material is epitaxially (epi) grown in the trench having the second profile. The method 100 continues with block 118 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2A-7A are perspective views of a FinFET device 200, in portion or entirety, at various stages of fabrication according to the method 100 of FIG. 1. FIGS. 2B-7B are diagrammatic cross-sectional views along a channel of a fin structure of the FinFET device 200 illustrated in FIGS. 2A-7A, respectively. In the present disclosure, the term FinFET device refers to any fin-based, multi-gate transistor. The FinFET device 200 may be included in a microprocessor, memory cell, and/or other integrated circuit device. FIGS. 2A-7A and FIGS. 2B-7B have been simplified for the sake of clarity to better understand the inventive concepts of the present disclosure. Additional features can be added in the FinFET device 200, and some of the features described below can be replaced or eliminated in other embodiments of the integrated circuit device 200.

Figure 2A:
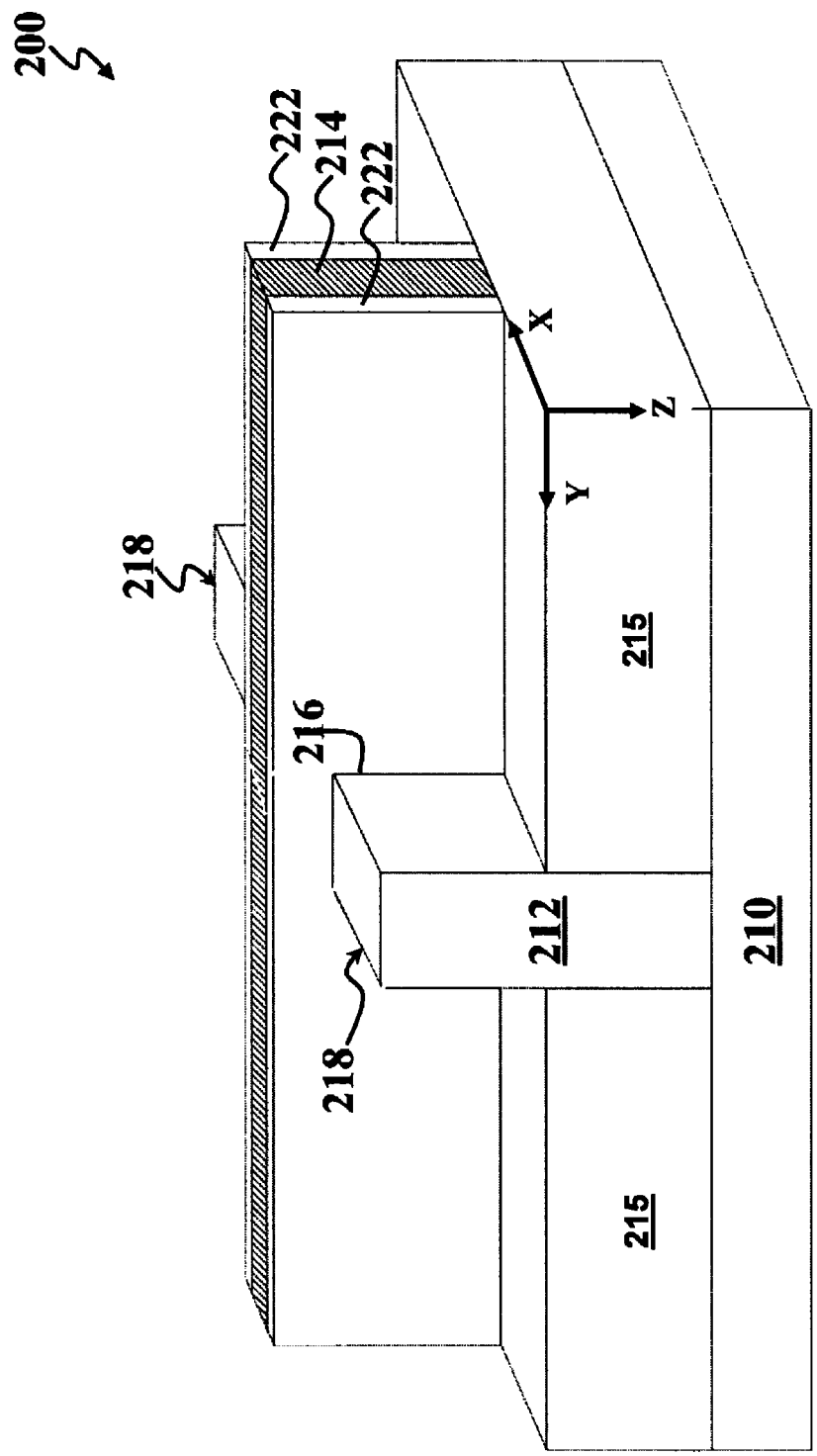
Figure 2B:
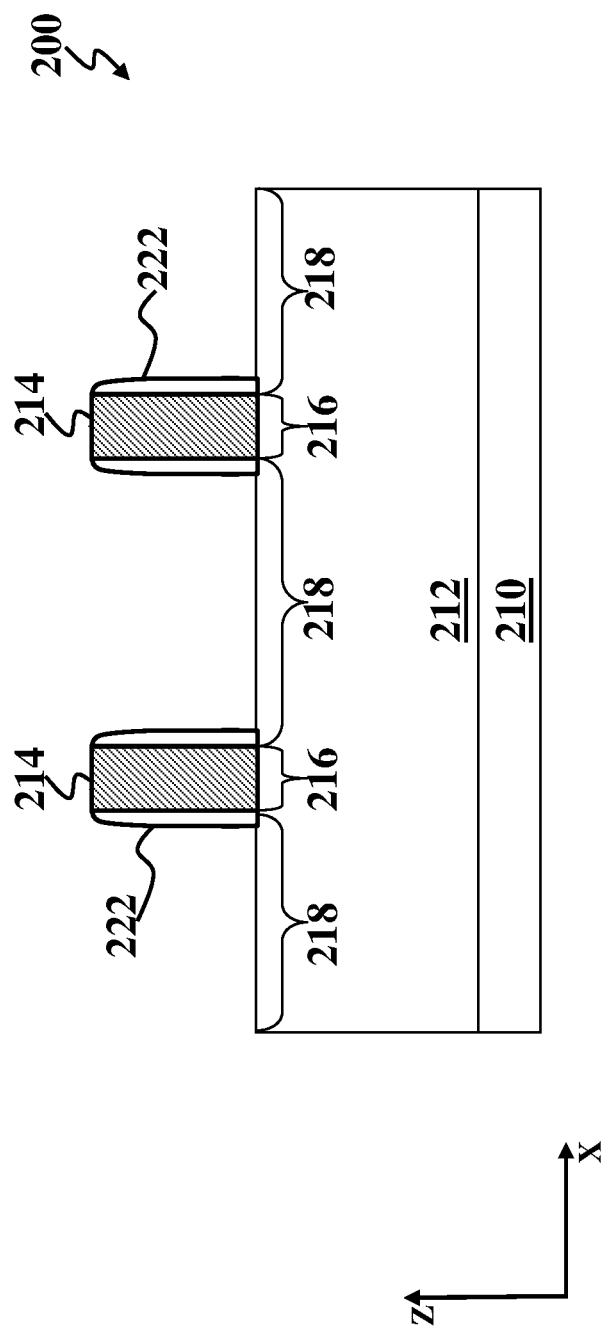

Referring to FIGS. 2A and 2B, the FinFET device 200 includes a substrate (wafer) 210. The substrate 210 is a bulk silicon substrate. Alternatively, the substrate 210 comprises an elementary semiconductor, such as silicon or germanium in a crystalline structure; a compound semiconductor, such as silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

The FinFET device 200 includes a fin structure 212, such as a Si fin, that extends from the substrate 210. The fin structure 212 is formed by a suitable process, such as a lithography and etching process. For example, the fin structure 212 may be formed by forming a photoresist layer (resist) overlying the substrate, exposing the resist to a pattern, performing a post-exposure bake process, and developing the resist to form a masking element including the resist. The masking element may then be used to etch the fin structure 212 into the silicon substrate 210. The fin structure 212 may be etched using a reactive ion etch (RIE) and/or other suitable process. Alternatively, the fin structure 212 is formed by a double-patterning lithography (DPL) process. DPL is a method of constructing a pattern on a substrate by dividing the pattern into two interleaved patterns. DPL allows enhanced feature (e.g., fin)

density. Various DPL methodologies may be used including double exposure (e.g., using two mask sets), forming spacers adjacent features and removing the features to provide a pattern of spacers, resist freezing, and/or other suitable processes.

Isolation features 215, such as shallow trench isolation (STI) structures, surround the fin structure 212 and isolate the fin structure 212 from other not-illustrated fins of the FinFET device 200. The isolation features 215 may be formed by partially filling trenches surrounding the fin structure 212 (formed after etching the substrate 210 to form the fin structure 212) with an insulating material, such as silicon oxide, silicon nitride, silicon oxynitride, other suitable material, or combinations thereof. The filled trench may have a multi-layer structure, for example, a thermal oxide liner layer with silicon nitride filling the trench.

The FinFET device 200 includes a gate structure 214. The gate structure 214 traverses the fin structure 212, and in the depicted embodiment, is formed on a central portion of the fin structure 212. The gate layer 214 may include a gate dielectric layer, a gate electrode, and a hard mask layer. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate electrode may be formed in a gate first or gate last process. The gate structure 214 may include numerous other layers, for example, capping layers, interface layers, diffusion layers, barrier layers, or combinations thereof. The hard mask layer may be formed over the gate electrode. The hard mask layer includes silicon oxide, silicon nitride, silicon oxynitride, silicon carbide, other suitable material, or combinations thereof.

The gate structure 214 is formed by a suitable process, including deposition, lithography patterning, and etching processes. The deposition processes include chemical vapor deposition (CVD), physical vapor deposition (PVD), atomic layer deposition (ALD), high density plasma CVD (HD-PCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

The fin structure 212 includes a channel region 216 surrounded by the gate structure 214. The fin structure 212 further includes source and drain regions 218. FIG. 2B is a diagrammatic cross-sectional view along the fin structure 212 of the FinFET device 200 in FIG. 2A. As illustrated in FIG. 2B, the fin structure 210 includes multiple gate structures 214, with the gate structures 214 sharing source and drain (S/D) regions 218. Each of the gate structures 214 may include similar or different layer configurations and/or compositions, depending on design requirements for the FinFET device 200.

Seal spacers 222 are formed for the gate structure 214 as illustrated in FIGS. 2A and 2B. The seal spacers 222 are disposed on sidewalls of the gate structure 214. The seal spacers 222 are formed by a suitable process to a suitable thickness. For example, a dielectric layer, such as a silicon oxide layer, is blanket deposited over the integrated circuit device 200; and then, the silicon oxide layer is etched to remove the silicon oxide layer to form seal spacers 222 as illustrated in FIGS. 2A and 2B. Alternatively, the seal spacers 222 include another dielectric material, such as silicon nitride, silicon oxynitride, or combinations thereof. Implantation, diffusion, and/or annealing processes may be performed to form lightly doped S/D (LDD) features in the fin structure 212, of a p-type if the FinFET device 200 is a PMOS device, or of an n-type if the FinFET device 200 is an NMOS device. However, as will be discussed below, in the depicted embodiment, the FinFET device 200 includes strained source/drain features that eliminate the need for LDD features, without degrading device performance.

Figure 3A:
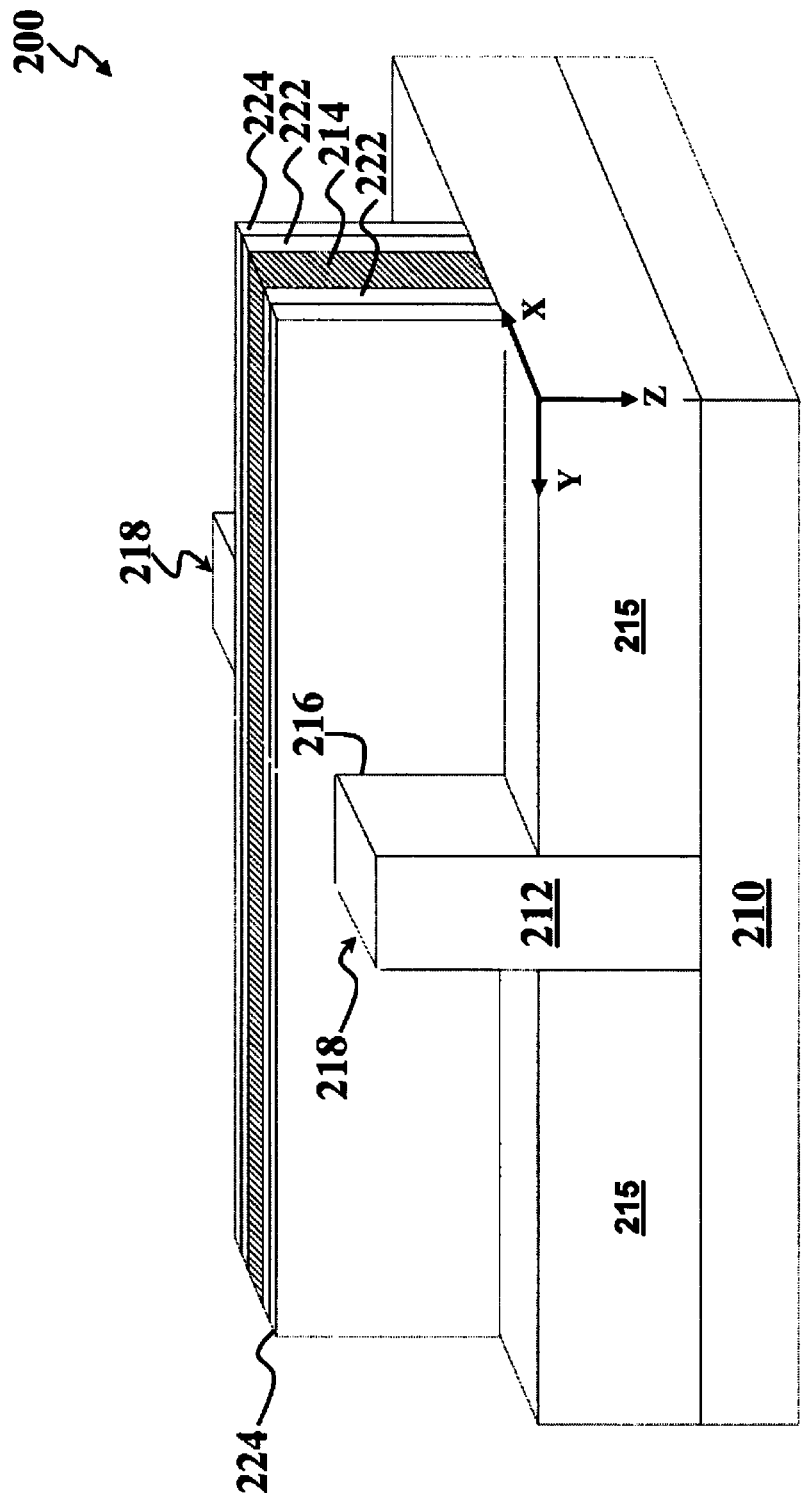
Figure 3B:
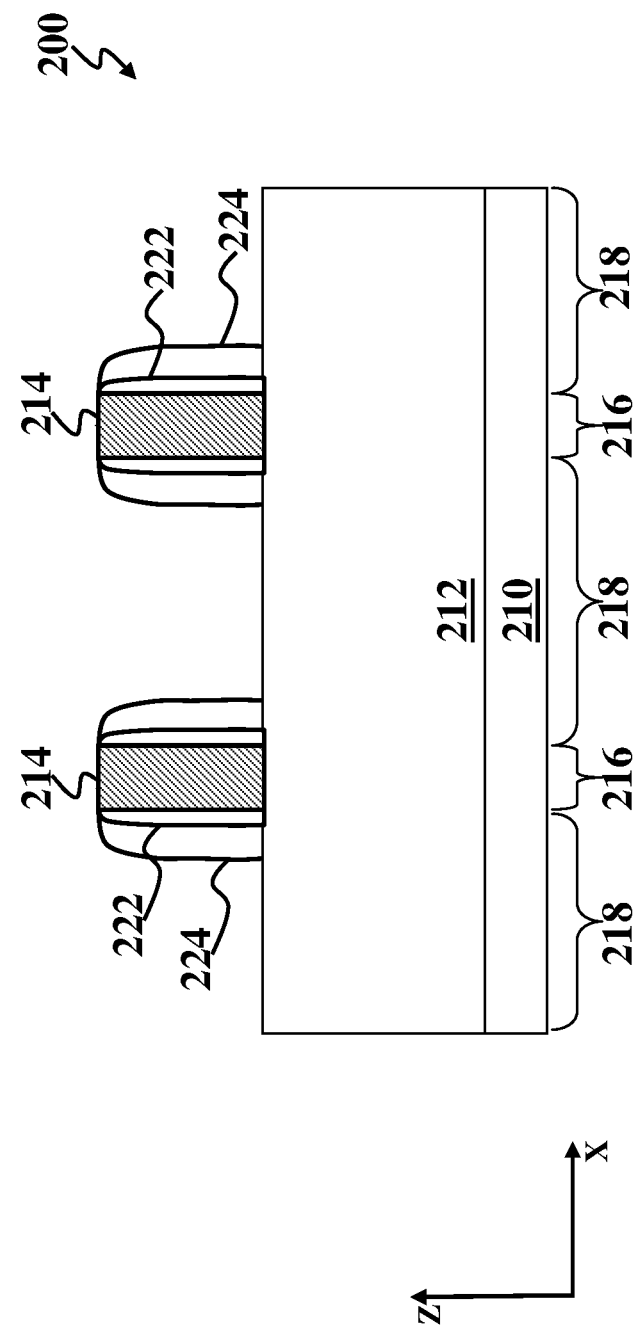

Referring to FIGS. 3A and 3B, dummy spacers 224 are disposed on the seal spacers 222. The dummy spacers 224 comprise a dielectric material, such as silicon oxide, silicon nitride, silicon oxynitride, other suitable material, or combinations thereof. The dummy spacers 224 may include a multi-layer structure, such as a multi-layer structure including a silicon nitride layer and a silicon oxide layer. The dummy spacers 224 are formed by a suitable process to a suitable thickness, such as the process described for forming seal spacers 222. For example, dummy spacers 224 may be formed by depositing silicon nitride and silicon oxide layers and then dry etching the layers to form the dummy spacers as illustrated in FIGS. 3A and 3B.

Figure 4A:
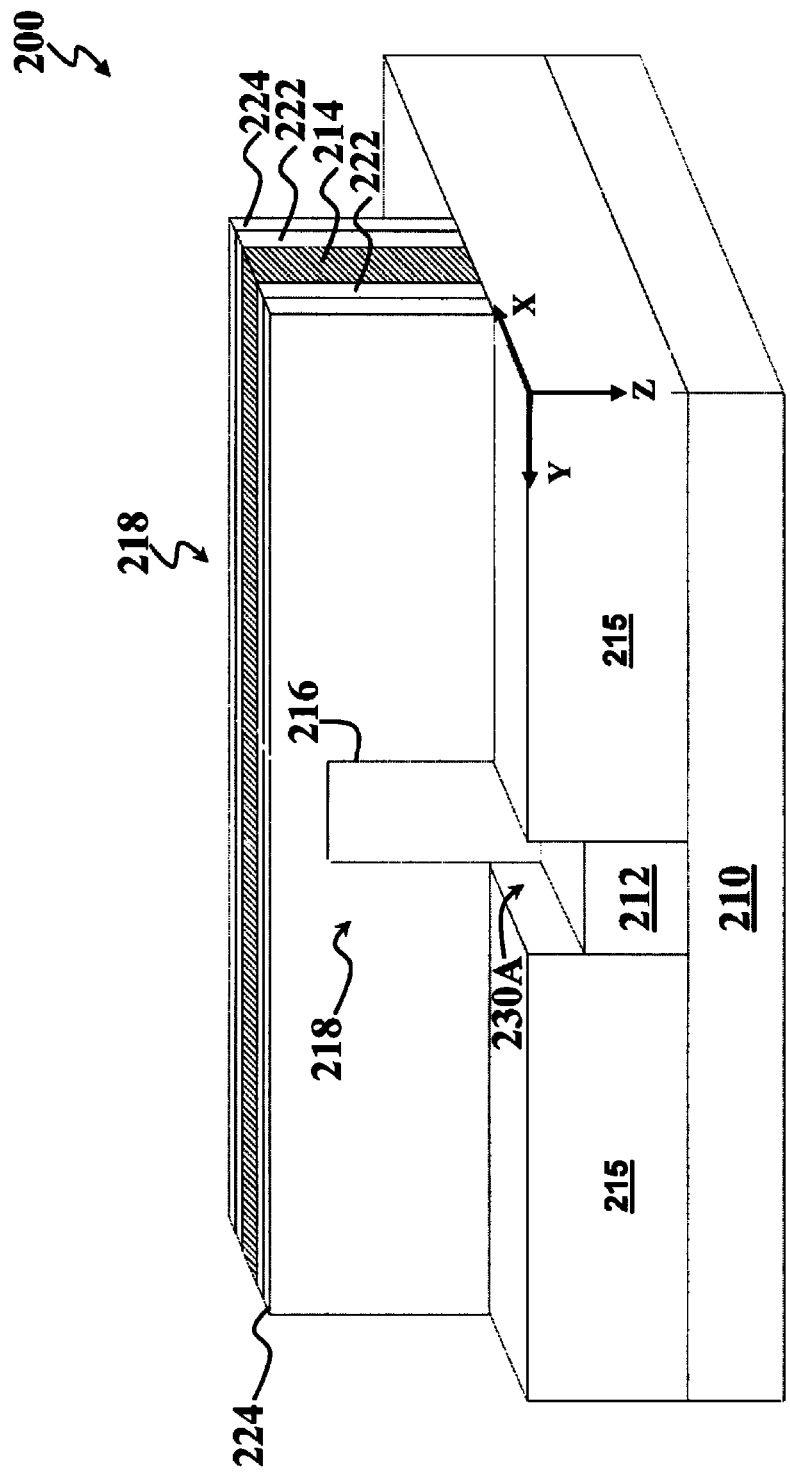
Figure 4B:
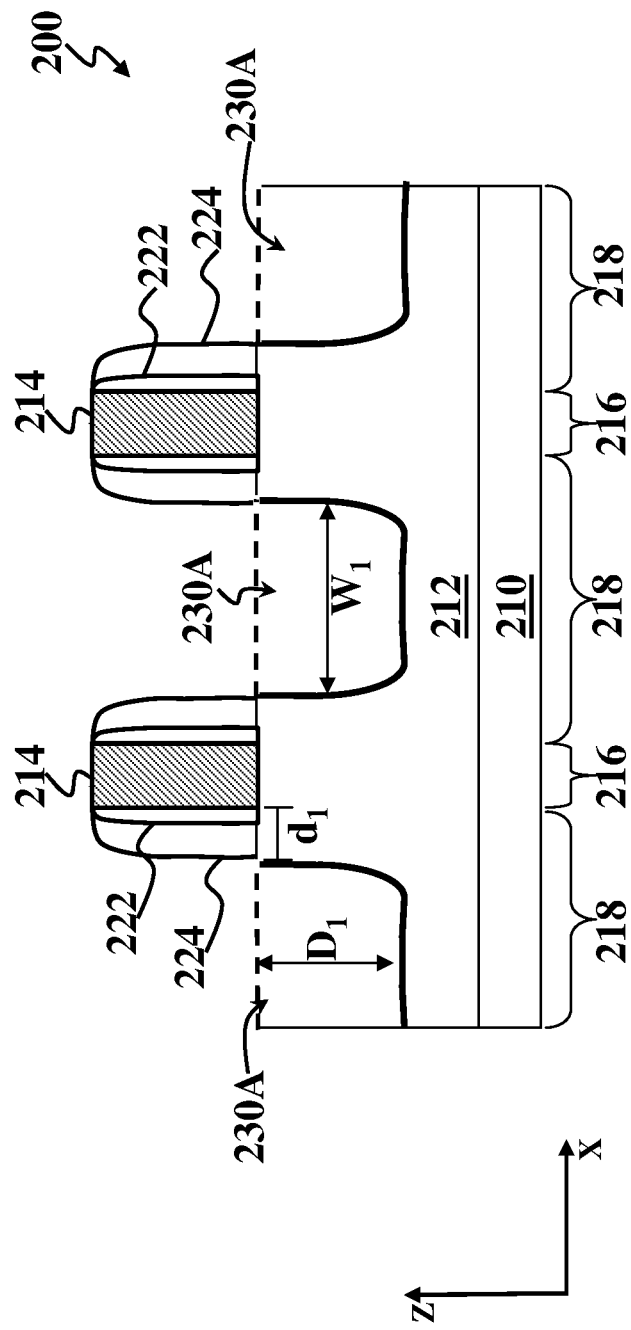

Referring to FIGS. 4A and 4B, a trench having a first profile 230A is formed in the fin structure 212. The first profile is a U-shaped profile. The trench having the first profile 230A has a depth $D_1$ and a width $W_1$. The depth $D_1$ is about 10 nm to about 90 nm. In the depicted embodiment, the depth $D_1$ is about 60 nm. A distance, $d_1$, is between the channel region 216 and trench having the first profile 230A. In the depicted embodiment, the distance $d_1$ is approximately equal to the combined thickness of the dummy spacers 224 and seal spacers 222. The trench having the first profile 230A is formed by etching the fin structure 212. In the depicted embodiment, the fin structure 212 is etched by a dry etching process. Alternatively, the etching process is a wet etching process, or combination dry and wet etching process. A lithography process may be implemented to form the trench having the first profile 230A. For example, forming the trench having the first profile 230A may include forming a photoresist layer or a capping layer (such as an oxide capping layer) over the FinFET device 200, patterning the photoresist or capping layer to have openings that expose the S/D regions 218 of the fin structure 212, and etching the trench having the first profile 230A in the S/D regions 218 of the fin structure 212. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology.

Typically, strained S/D features are formed in U-shaped trenches in the fin structure, such as the trench having the first profile 230A illustrated in FIGS. 4A and 4B. The strained S/D features thus exhibit a U-shaped structure. The U-shaped, strained S/D features introduce strain to the device channel, such as channel region 216 of the FinFET device 200. The device strain enhances carrier mobility and improves device performance. However, as device technology nodes are continually scaled down, the device strain induced by the U-shaped, strained S/D features is insufficient for device performance boosting. Accordingly, as device scaling continues, higher device strain is desired to provide enhanced carrier mobility and improved device performance in scaled down devices. As will be discussed below, the disclosed FinFET device 200 provides strained S/D features formed in a trench having a profile different than the U-shaped profile, such as a T-shaped profile. The disclosed strained S/D features provide increased device strain, even in scaled down devices.

Figure 5A:
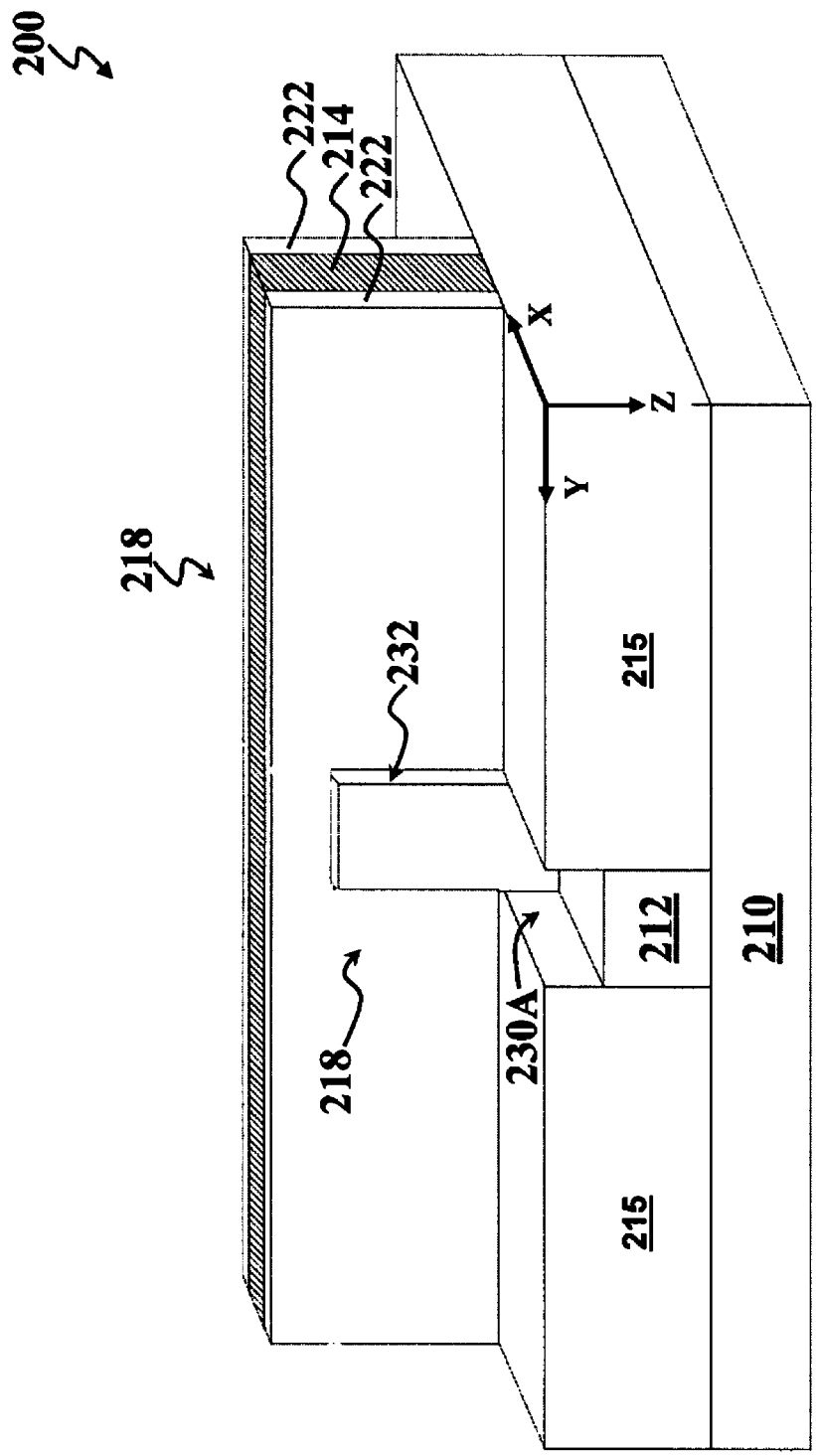
Figure 5B:
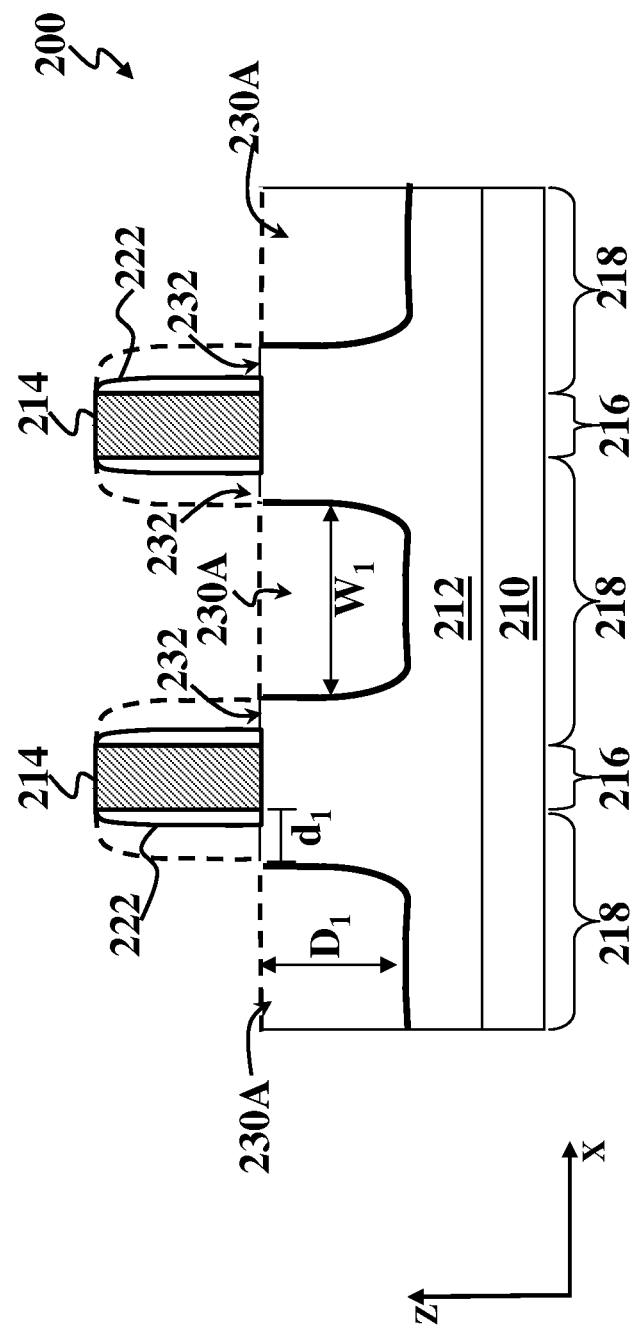

Referring to FIGS. 5A and 5B, dummy spacers 224 are removed from the FinFET device 200 by a suitable process, exposing portions 232 of the fin structure 212. The dummy spacers 224 are removed by a suitable process, such as a dry etching process, wet etching process, other suitable process, or combinations thereof. The exposed portions 232 of the fin structure 212 are portions of the fin structure 212 that were protected by the dummy spacers 224 while forming the trench having the first profile 230A.

Figure 6A:
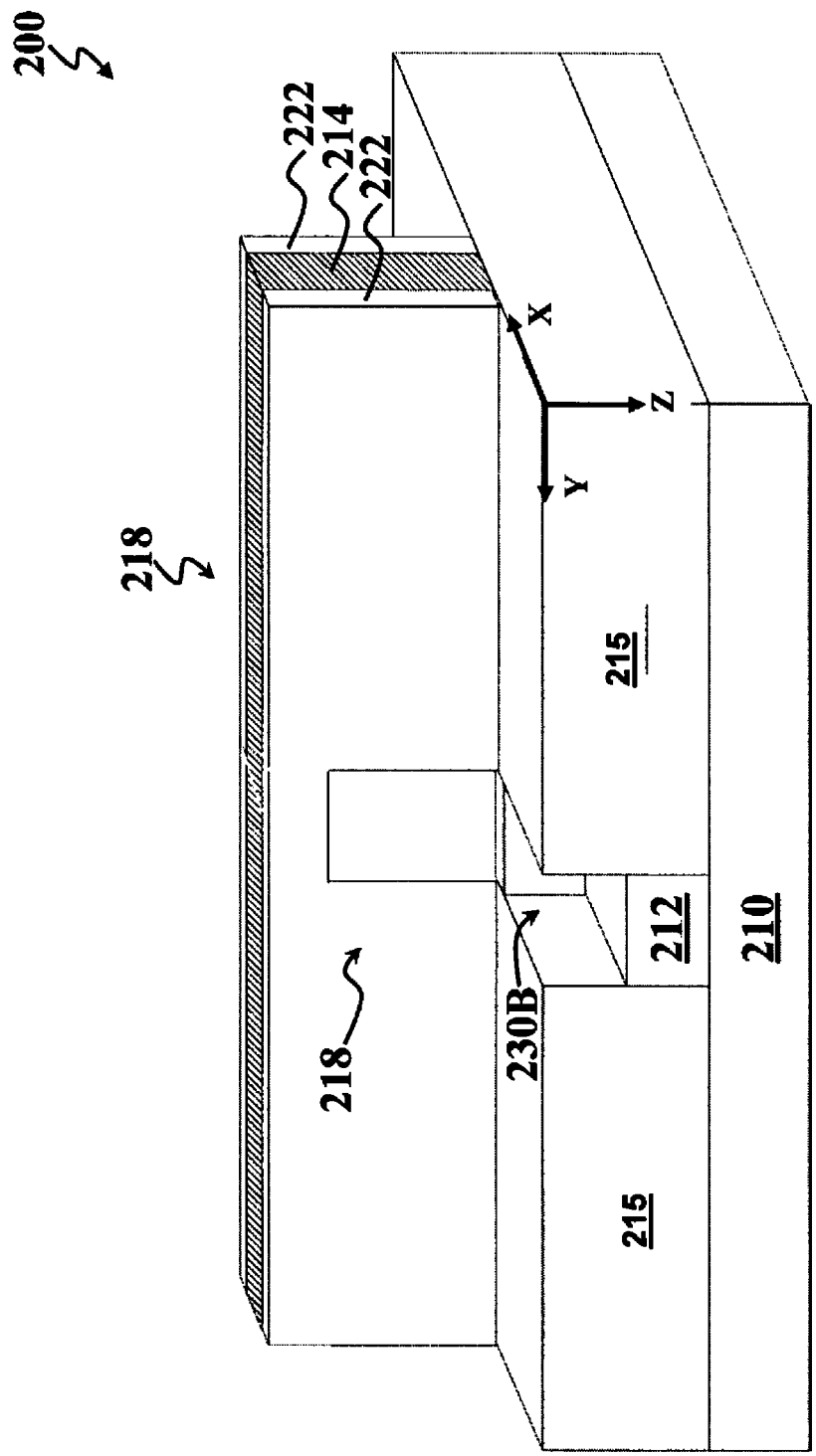
Figure 6B:
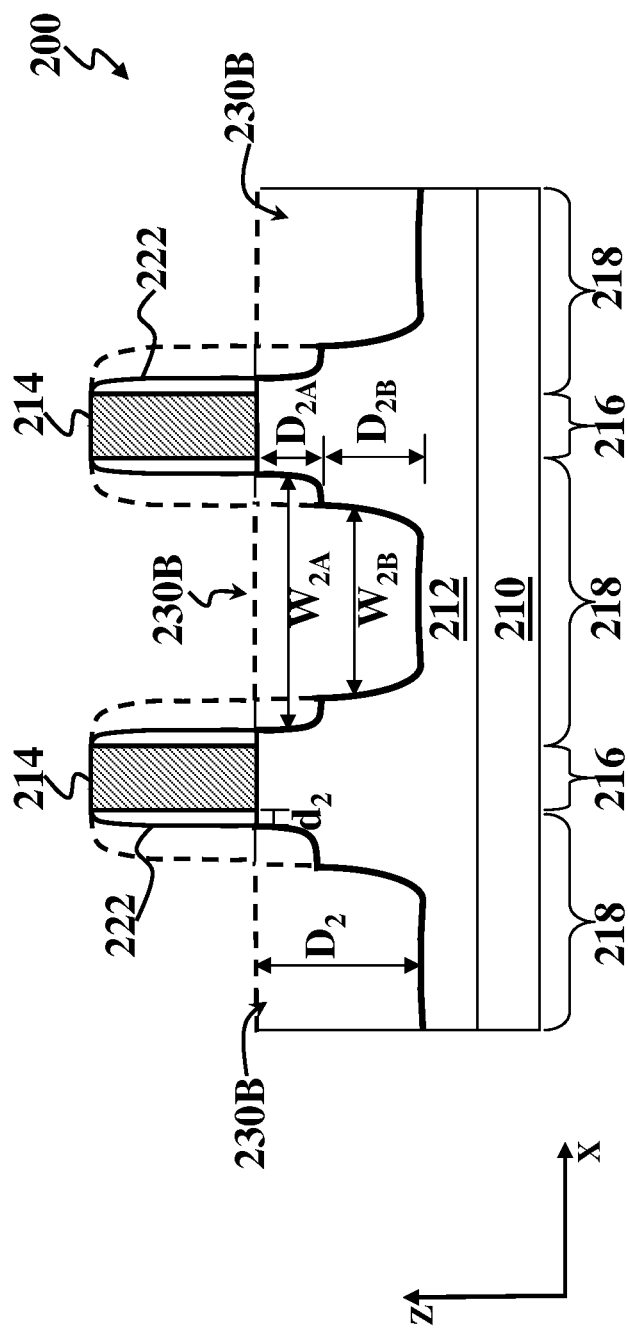

Referring to FIGS. 6A and 6B, the trench having the first profile 230A is modified to form a trench having a second profile 230B. The second profile is a T-shaped profile. The trench having the second profile 230B has a depth $D_2$. The depth $D_2$ is greater than or equal to the depth $D_1$, and is about 80 nm to about 140 nm. In the depicted embodiment, the depth $D_2$ is about 90 nm. In contrast to the trench having the first profile 230A, the trench having the second profile 230B includes a portion having a depth $D_{2A}$ and a width $W_{2A}$, and another portion having a depth $D_{2B}$ and a width $W_{2B}$. The width $W_{2A}$ is greater than the width $W_{2B}$, and the depth $D_{2A}$ is less than or equal to the depth $D_{2B}$. For example, the depth $D_{2A}$ is about 20 nm to about 60 nm, and the depth $D_{2B}$ is about 20 nm to about 80 nm. In the depicted embodiment, the depth $D_{2A}$ is about 30 nm, and the depth $D_{2B}$ is about 60 nm. The width $W_{2A}$ is greater than the width $W_1$, and the width $W_{2B}$ is greater than or equal to the width $W_1$. A distance, $d_2$, is between the channel region 216 and the trench having the second profile 230B. The distance $d_2$ is substantially less than the distance $d_1$. In the depicted embodiment, the distance $d_2$ is approximately equal to the thickness of the seal spacers 222. The trench having the second profile 230B is thus in closer proximity to the channel region 216 as compared to the trench having the first profile 230A. Alternatively, the second profile may be a shape other than a T-shape, including a U-shape profile, so long as the trench having the second profile 230B is the distance $d_2$ from the channel region 216, which is substantially less than the distance $d_1$ between the trench having the first profile 230A and the channel region 216.

The trench having the second profile 230B is formed by etching the fin structure 212, and specifically, by etching the portions 232 of the fin structure 212, which are exposed when the dummy spacers 224 are removed. In the depicted embodiment, the fin structure 212 is etched by a dry etching process. The dry etching process may be the same or different from the etching process used to form the trench having the first profile 230A. Alternatively, the etching process is a wet etching process, or combination dry and wet etching process. A lithography process may be implemented to form the trench having the second profile 230B. For example, forming the trench having the second profile 230B may include forming a photoresist layer or a capping layer (such as an oxide capping layer) over the FinFET device 200, patterning the photoresist or capping layer to have openings that expose the S/D regions 218 of the fin structure 212, and etching the trench having the second profile 230B in the S/D regions 218 of the fin structure 212. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology.

Figure 7A:
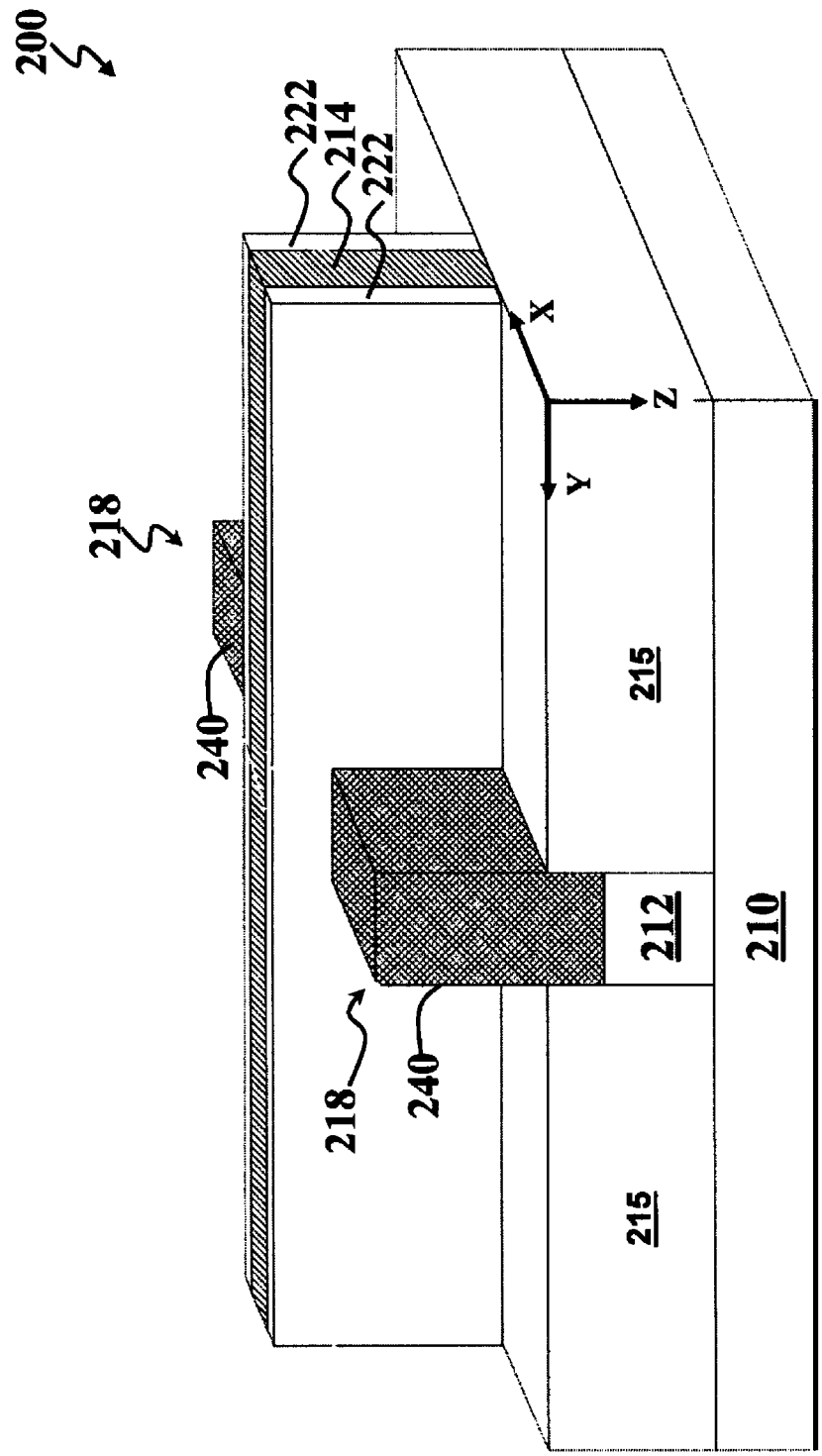
Figure 7B:
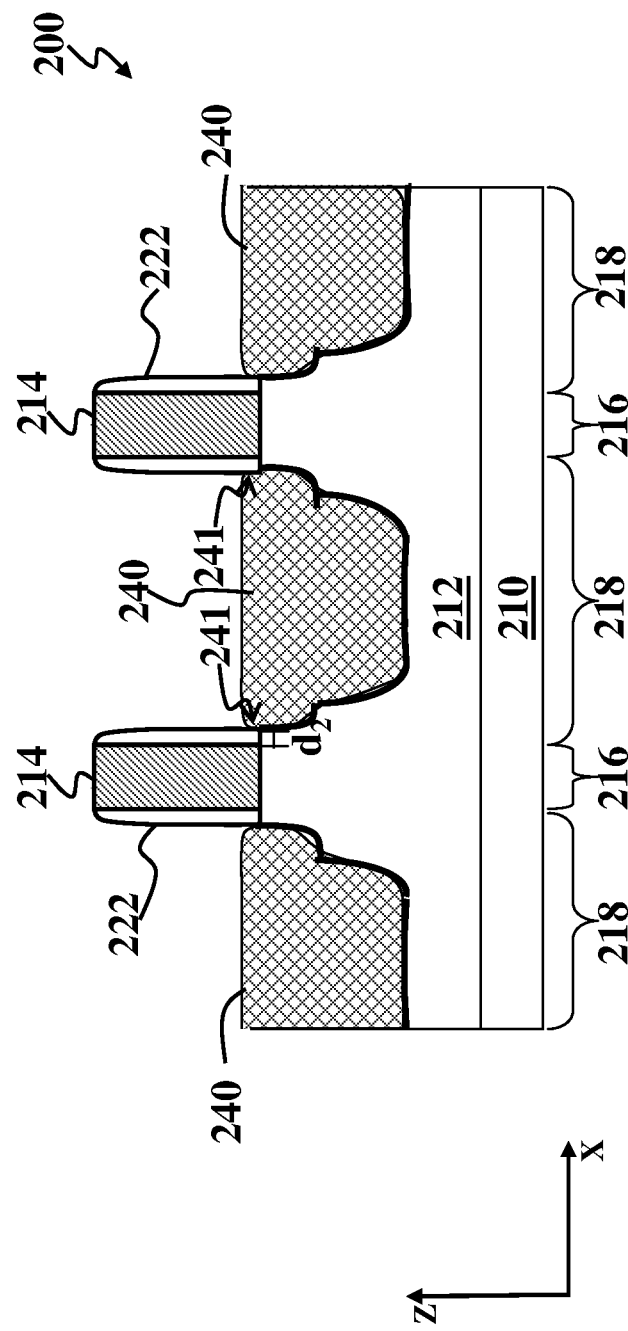

Referring to FIGS. 7A and 7B, a semiconductor material is epitaxially (epi) grown on the fin structure 212 in the trench having the second profile 230B, forming raised/strained S/D features 240 in the S/D regions 218 of the fin structure 212. The strained S/D features 240 are formed by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 212 (e.g., silicon). In the depicted embodiment, the FinFET device 200 is a PMOS device, and thus, the strained S/D features 240 comprise silicon germanium (SiGe), formed by a silicon germanium epitaxial deposition process. Alternatively, the FinFET device 200 could be an NMOS device, and thus, the strained S/D features 240 could comprise silicon (Si). The strained S/D features 240 may be doped during its deposition (growth) by adding impurities to the source material of the epitaxy process or subsequent to its deposition growth process by an ion implantation process. For example, a silicon epi layer may be doped with phosphorous (to form a Si:P epi layer). The doped epitaxial layer may have a gradient doping profile. Subsequently, a CMP process may be performed to planarize the strained S/D features 240. Prior to or after forming the strained S/D features 240, implantation, diffusion, and/or annealing processes may be performed to form heavily doped S/D (HDD) features in the S/D regions 218 of the fin structure 212, of a p-type if the FinFET device 200 is a PMOS device, or of an n-type if the FinFET device 200 is an NMOS device.

As illustrated in FIGS. 7A and 7B, the strained S/D features 240 have a T-shaped profile/structure. The strained S/D features 240 are the distance $d_2$ from the channel region 216 of the FinFET device 200. The close proximity of the strained S/D features 240 to the channel region 216 provides increased, higher strain to the channel region 216 of the FinFET device 200, when compared to traditional FinFET devices. The strained S/D features 240 also encroach on the spacer region of the FinFET device 200. For example, portions 241 of the strained S/D features 240 are in direct contact with the seal spacers 222.

The FinFET device 200 may include additional features, which may be formed by subsequent processing. For example, main spacers may be disposed on the seal spacers 222, in which case, the main spacers are disposed on the strained S/D features 240. Where the HDD features are formed after the raised S/D features 240, the HDD features are formed after the main spacers are formed. Silicide features may be formed in the S/D regions 218 of the fin structure 212, specifically on the raised S/D features 240. The silicide features may be formed by a silicidation process, such as a self-aligned silicide (salicide) process. Various contacts/vias/lines and multilayer interconnect features (e.g., metal layers and interlayer dielectrics) may be formed over the substrate 210, configured to connect the various features or structures of the FinFET device 200. The additional features may provide electrical interconnection to the device 200 including the formed gate structures 214. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed method and semiconductor device provide strained S/D features in close proximity to the channel region of the semiconductor device, providing increased strain to the semiconductor device channel region. The strain effect achieved by the disclosed method and semiconductor device can provide at least 10% higher drain current, as compared to traditional semiconductor devices having strained features. The strain effect achieved also provides the option of skipping LDD implantations, because the performance of the disclosed semiconductor device is not degraded by eliminating LDD features. Further, the method disclosed for achieving the strained structure described herein is easily implemented into current processing. Different embodiments may have different advantages, and no particular advantage is necessarily required of any embodiment.

The present disclosure provides for many different embodiments. In an example, the disclosed semiconductor device includes a semiconductor substrate; a fin structure disposed over the semiconductor substrate; and a gate structure disposed on a portion of the fin structure. The gate structure traverses the fin structure and separates a source region and a drain region of the fin structure, the source and drain region defining a channel therebetween. The source and drain region of the fin structure include a strained source and drain feature. The strained source feature and the strained drain feature each include: a first portion having a first width and a first depth; and a second portion disposed below the first portion, the second portion having a second width and a second depth. The first width is greater than the second width, and the first depth is less than the second depth. The semiconductor device may include seal spacers disposed on sidewalls of the gate structure and traversing the fin structure. The first portion of the source and drain features may be spaced away from the channel by a distance that is approximately equal to a thickness of one of the seal spacers. The first portion of the strained source and drain feature may include a portion that directly contacts the seal spacers. The strained source and drain feature may include silicon germanium and/or have a T-shaped profile.

In another example, a FinFET device includes a semiconductor substrate; a fin structure disposed over the semiconductor substrate; and a gate structure disposed on a portion of the fin structure. The gate structure traverses the fin structure and separates a source region and a drain region of the fin structure. The source and drain region define a channel therebetween. A set of seal spacers disposed on sidewalls of the gate structure and traverse the fin structure. The source and drain region include a strained source and drain feature that has a portion that directly contacts with the seal spacers. The strained source and drain feature may have a T-shaped profile. The strained source and drain feature may include: a first portion having a first width and a first depth, and a second portion disposed below the first portion, the second portion having a second width and a second depth. The first width may be greater than the second width, and the first depth may be less than the second depth. A distance between the channel and the source and drain feature is approximately equal to a thickness of one of the seal spacers. The strained source and drain feature may include silicon germanium.

In yet another example, the disclosed method includes providing a substrate; forming a fin structure over the substrate; forming a gate structure over a portion of the fin structure; forming spacers on sidewalls of the gate structure; forming dummy spacers adjacent to the spacers; forming a trench having a first profile in the fin structure; thereafter, removing the dummy spacers; modifying the trench having the first profile in the fin structure, such that the trench has a second profile; and epitaxially (epi) growing a semiconductor material in the trench having the second profile. Forming the trench having the first profile may include applying a first etch process to the fin structure to form a trench having a U-shaped profile, modifying the trench having the first profile in the fin structure, such that the trench has the second profile may include applying a second etch process to the fin structure to modify the U-shaped profile of the trench to a T-shaped profile. Removing the dummy spacers may include exposing a portion of the fin structure adjacent to the trench having the first profile, and thus, applying the first etch process may include etching the exposed portion of the fin structure.

Forming the trench having the first profile in the fin structure may include applying a first etch process to the fin structure to form a trench that is a first distance from a channel of the fin structure, and modifying the trench having the first profile in the fin structure, such that the trench has the second profile may include applying a second etch process to the fin structure such that the trench is a second distance from the channel of the fin structure. The second distance is less than the first distance. The first distance may be approximately equal to a combined thickness of a dummy spacer and a seal spacer, and the second distance may be approximately equal to the thickness of the seal spacer. Modifying the trench having the first profile in the fin structure, such that the trench has the second profile may include: etching the fin structure to form a first portion and a second portion of the trench having the second profile. The first portion has a first width and a first depth, and the second portion is disposed below the first portion and has a second width and a second depth. The first width may be greater than the second width, and the first depth may be less than the second depth. Forming spacers on sidewalls of the gate structure may include forming seal spacers, and epi growing the semiconductor material in the trench having the second profile may include filling the trench such that a portion of the semiconductor material is in direct contact with the seal spacers. Epi growing the semiconductor material in the trench having the second profile may include forming a silicon germanium source and drain feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device comprising:
a semiconductor substrate;
a fin structure disposed over the semiconductor substrate;
a gate structure disposed on a portion of the fin structure, the gate structure traversing the fin structure, wherein the gate structure separates a source region and a drain region of the fin structure, the source and drain region defining a channel therebetween; and
the source and drain region of the fin structure including a strained source and drain feature, wherein the strained source feature and the strained drain feature each include:
a first portion having a first width and a first depth, wherein the first portion directly interfaces with the fin structure, and
a second portion disposed below the first portion, the second portion having a second width defined by a first sidewall and a second sidewall, wherein the first and second sidewalls are substantially perpendicular to a top surface of the semiconductor substrate, and wherein the second portion has a second depth, wherein the first width is greater than the second width and the first depth is less than the second depth, wherein the second sidewall of the second portion directly interfaces with the fin structure, wherein the first and second portions are formed of entirely the same material.

2. The FinFET device of claim 1 including seal spacers disposed on sidewalls of the gate structure and traversing the fin structure, wherein the first portion of the source and drain features is spaced away from the channel by a distance that is approximately equal to a thickness of one of the seal spacers.

3. The FinFET device of claim 2 wherein the first portion of the strained source and drain feature includes a portion that directly contacts the seal spacers.

4. The FinFET device of claim 1 wherein the strained source and drain feature includes silicon germanium.

5. The FinFET device of claim 1 wherein the strained source and drain feature has a T-shaped profile.

6. The FinFET device of claim 1 wherein the semiconductor substrate and the fin structure include silicon.

7. A FinFET device comprising:
a fin structure of semiconductor material disposed over a semiconductor substrate;
a gate structure disposed on a portion of the fin structure, the gate structure traversing the fin structure, the gate structure separating a source region and a drain region of the fin structure, wherein the source and drain region define a channel therebetween;
a set of seal spacers disposed on sidewalls of the gate structure and traversing the fin structure; and
a source region and a drain region, wherein the source and drain region includes a strained source and drain feature respectively, the strained source and drain feature each include:
a first portion having a first width and a first depth, wherein the first portion has at least a portion in direct contact with the seal spacers has a first edge extending to a depth within the fin structure that is below the gate structure, the edge being substantially coplanar with an outer edge of one of the seal spacers from the set of seal spacers to the depth within the fin structure, and wherein the first edge directly interfaces the fin structure of semiconductor material; and
a second portion disposed below the first portion, the second portion having a second width, a second depth, and a second edge expending to the second depth within the fin structure, wherein the first width is greater than the second width and wherein the second edge directly interfaces the fin structure of semiconductor material, and wherein the strained source and drain feature being formed entirely of the same material.

8. The FinFET device of claim 7 wherein the strained source and drain feature has a T-shaped profile.

9. The FinFET device of claim 7 wherein the first depth is less than the second depth.

10. The FinFET device of claim 7 wherein a distance between the channel and the source and drain feature is approximately equal to a thickness of one of the seal spacers.

11. The FinFET device of claim 7 wherein the strained source and drain feature includes silicon germanium.

12. The FinFET device of claim 7 wherein the semiconductor substrate and the fin structure include silicon.

13. A semiconductor device, comprising:
a fin structure of semiconductor material disposed over the semiconductor substrate;
a first gate structure disposed on and traversing a portion of the fin structure;
a second gate structure disposed on and traversing another portion of the fin structure;
a source/drain region interposing the first and second gate structures, wherein the source/drain region includes a contiguous region comprising a material and having:
a first portion having a first width defined by a first and second edge; and
a second portion disposed below the first portion having a second width defined by a third and fourth edge, wherein the first width is greater than the second width, wherein each of the first, second, third and fourth edges directly interfaces with the fin structure.

14. The semiconductor device of claim 13, wherein the first edge is substantially collinear with an edge of a first spacer formed on a sidewall of the first gate structure.

15. The semiconductor device of claim 14, wherein the second edge is substantially collinear with an edge of a second spacer formed on a sidewall of the second gate structure.

16. The semiconductor device of claim 13, wherein the first portion has a first depth and the second portion has a second depth, and wherein the first depth is less than the second depth.

17. The semiconductor device of claim 13, wherein the material of the contiguous region is silicon germanium.

18. The semiconductor device of claim 13, wherein the material of the contiguous region is silicon.

19. The semiconductor device of claim 18, wherein the silicon is epitaxial silicon.

* * * * *